United States Patent
Yong et al.

(10) Patent No.: US 12,417,939 B2
(45) Date of Patent: Sep. 16, 2025

(54) SEMICONDUCTOR DEVICE AND METHOD OF DETECTING SEMICONDUCTOR WAFER CENTERED ON TAPE

(71) Applicant: STATS ChipPAC Pte. Ltd., Singapore (SG)

(72) Inventors: Tack Chee Yong, Singapore (SG); Yi Jing Eric Chong, Singapore (SG); Kok Lim Jason Ng, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 184 days.

(21) Appl. No.: 18/479,276

(22) Filed: Oct. 2, 2023

(65) Prior Publication Data
US 2025/0112078 A1    Apr. 3, 2025

(51) Int. Cl.
*H01L 21/683* (2006.01)
*H01L 21/67* (2006.01)
*H01L 21/68* (2006.01)

(52) U.S. Cl.
CPC .... *H01L 21/6836* (2013.01); *H01L 21/67259* (2013.01); *H01L 21/681* (2013.01); *H01L 2221/68309* (2013.01)

(58) Field of Classification Search
CPC ........... H01L 21/6836; H01L 21/67259; H01L 21/681; H01L 2221/68309; H01L 21/67132; H01L 2221/68327; H01L 21/67294; H01L 23/544; H01L 2223/54426
See application file for complete search history.

(56) References Cited

U.S. PATENT DOCUMENTS

| | | |
|---|---|---|
| 7,008,802 B2 | 3/2006 | Lu |
| 7,486,878 B2 | 2/2009 | Chen et al. |
| 2021/0247326 A1 | 8/2021 | Yoshimura |

FOREIGN PATENT DOCUMENTS

JP    H06151553 A    *    5/1994

OTHER PUBLICATIONS

JPH06151553A Machine Translation of Description (Year: 2025).*

* cited by examiner

*Primary Examiner* — Cynthia L Schaller
(74) *Attorney, Agent, or Firm* — Robert D. Atkins; PATENT LAW GROUP: Atkins and Associates, P.C.

(57) ABSTRACT

A semiconductor manufacturing equipment has a wafer tape including a plurality of alignment holes formed through the wafer tape. A semiconductor wafer is disposed over the wafer tape. The semiconductor wafer includes a circular or rectangular form-factor. A light source is disposed under the wafer tape. The semiconductor wafer is misaligned on the wafer tape with light passing through one or more alignment holes. The semiconductor wafer is centered on the wafer tape with no light passing through one or more alignment holes. The wafer tape has a plurality of wafer alignment markings for different size semiconductor wafers. A light detector is disposed over the semiconductor wafer to detect light passing through the wafer tape. A control arm can be attached to the semiconductor wafer to provide the ability to move the semiconductor wafer in response to a control signal from the light detector.

25 Claims, 16 Drawing Sheets

SEMICONDUCTOR DEVICE AND METHOD OF DETECTING SEMICONDUCTOR WAFER CENTERED ON TAPE

FIELD OF THE INVENTION

The present invention relates in general to semiconductor devices and, more particularly, to a semiconductor device and method of detecting a semiconductor wafer centered on a tape.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor wafer typically contains a plurality of semiconductor die separated by a saw street. The semiconductor wafer is commonly mounted to a tape to hold the wafer in place during various manufacturing operations, such as cleaning and dicing. The semiconductor wafer should be centered on the tape for proper alignment with respect to the jig or other dicing tool. The semiconductor wafer can be moved by hand to attempt to find the center of the tape. However, the manual centering is an estimation at best because the tape is non-transparent. Improper centering can cause imprecise cutting through the wafer and result in lower yield and higher manufacturing cost.

BRIEF DESCRIPTION OF THE DRAWINGS

FIGS. 2a-2l illustrate a wafer tape with alignment holes to center a semiconductor wafer;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
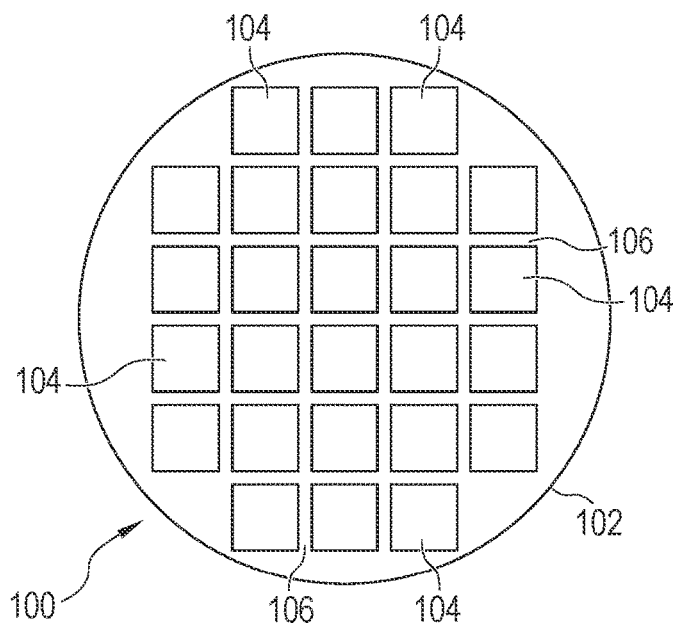
FIGS. 1a-1d illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. Semiconductor wafer 100 has a circular form-factor. In one embodiment, semiconductor wafer 100 has a width or diameter of 100-450 millimeters (mm).

Figure 1B:
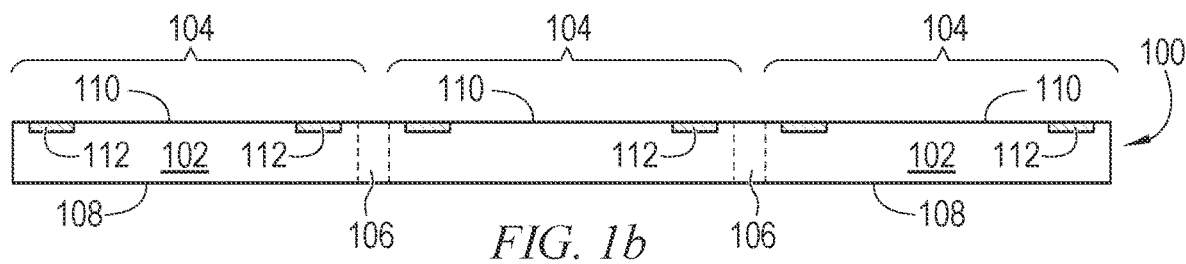

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 2A:
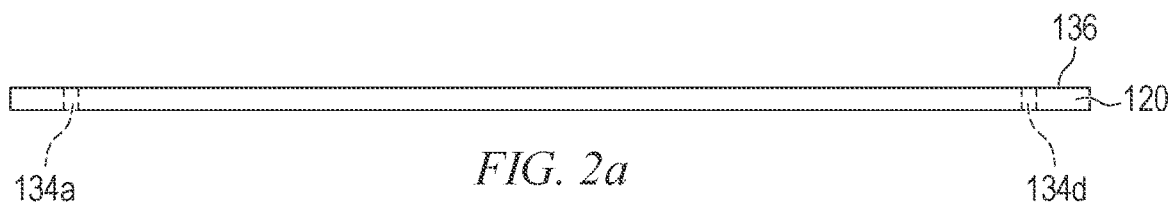
Figure 2B:
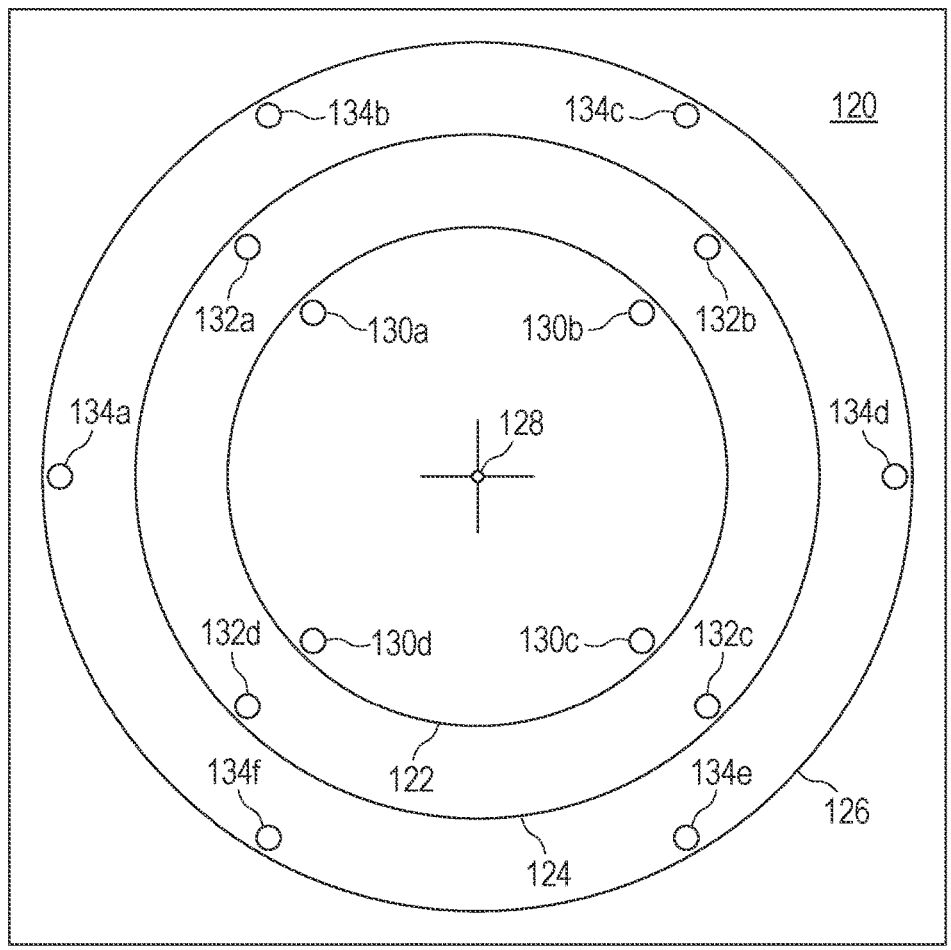
Figure 2C:
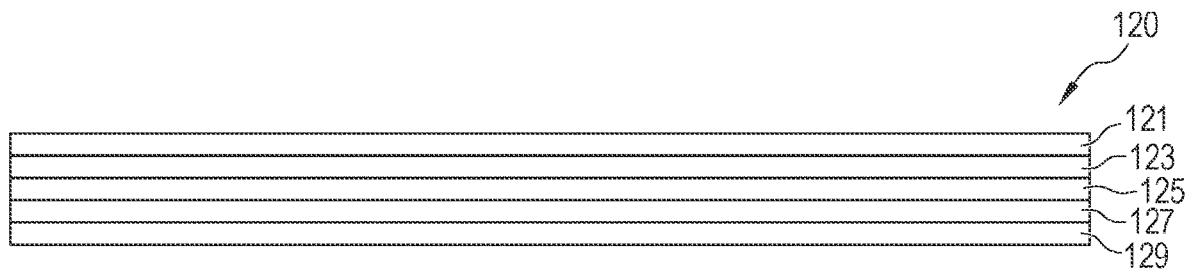

FIG. 2a shows backside coating (BSC) or wafer tape 120 made from polymer or epoxy with silver, silica, or alumina filler. FIG. 2b is a top view of BSC tape 120. BSC tape 120 provides support and protection for semiconductor wafer 100. BSC tape 120 has a thickness of 110 micrometers (mm) and is wider than the maximum wafer application. FIG. 2c shows further detail of BSC 120, including polyethylene terephthalate (PET) release film 121 having a thickness of 38 mm, double-sided tape 123 with PVC base film and having a thickness of 60 mm, thermosetting type backside coating film 125 having a thickness of 25 mm, acrylic release layer 127 having a thickness of 5 mm, and polyolefin base film 129 having a thickness of 80 mm. BSC tape 120 is non-transparent and blocks infrared light (IR).

In FIG. 2b, a first wafer alignment circle or marking 122 is shown for a 200 mm diameter wafer. A second wafer alignment circle or marking 124 is shown for a 300 mm diameter wafer. A third wafer alignment circle or marking 126 is shown for a 450 mm diameter wafer. A plurality of alignment openings or holes is formed in BSC tape 120 for each wafer alignment circle by stencil and punch, laser direct ablation (LDA), or etching process. There are generally at least three alignment holes for each wafer alignment circle. Four alignment holes 130a, 130b, 130c, and 130d are equally spaced around wafer alignment circuit 122, i.e., in 90-degree increments. There are four alignment holes 132a, 132b, 132c, and 132d, equally spaced around wafer alignment circuit 124, and six alignment holes 134a, 134b, 134c, 134d, 134e, and 134f, equally spaced around wafer alignment circuit 126, due to its larger size. The alignment holes 130-134 are typically circular, for a circular wafer, with a diameter of 5.0 mm, although the alignment holes can have other geometric shapes depending on the wafer. Each alignment circle can have any number of alignment holes. The alignment holes 130-134 are formed just inside the wafer alignment circle so that if semiconductor wafer 100 is disposed on the alignment circle, and centered with center 128, then the alignment circuit would be visible but all alignment holes for that particular alignment circle would not be visible as they would be covered by the semiconductor wafer. In that case, semiconductor wafer 100 would be considered as ideally aligned with center 128 of BSC tape 120.

Figure 2D:
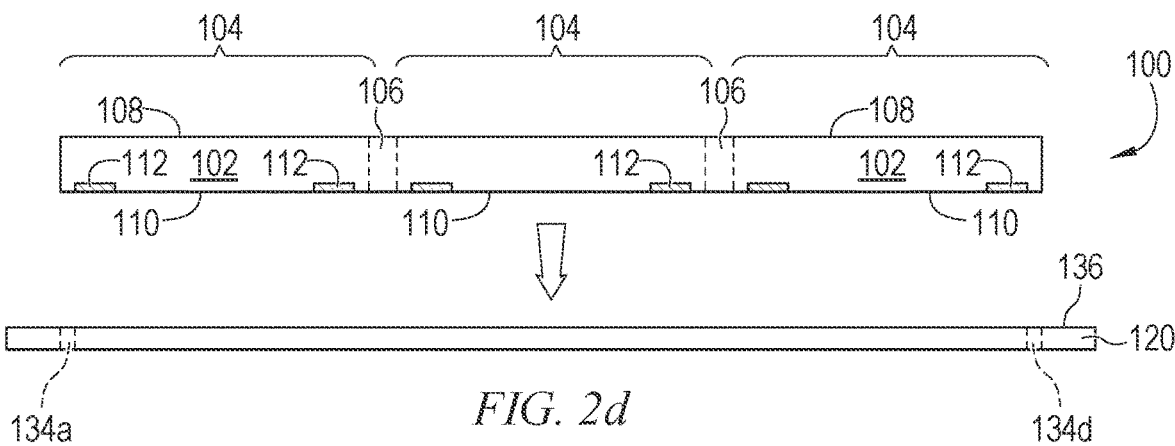
Figure 2E:
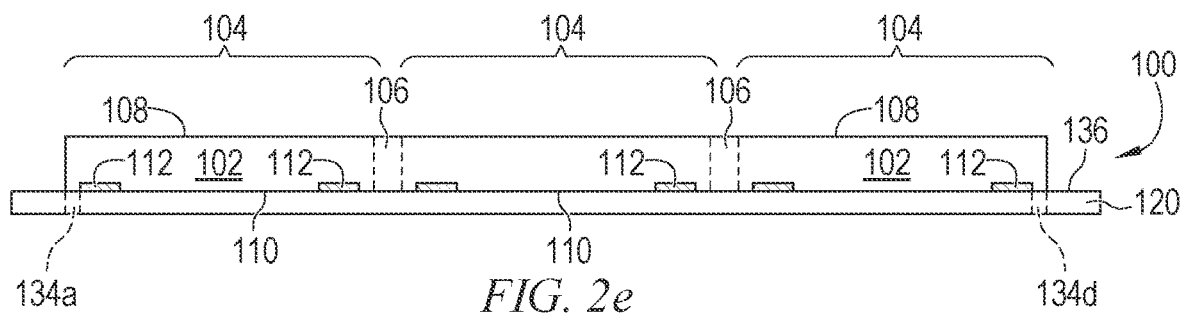
Figure 2F:
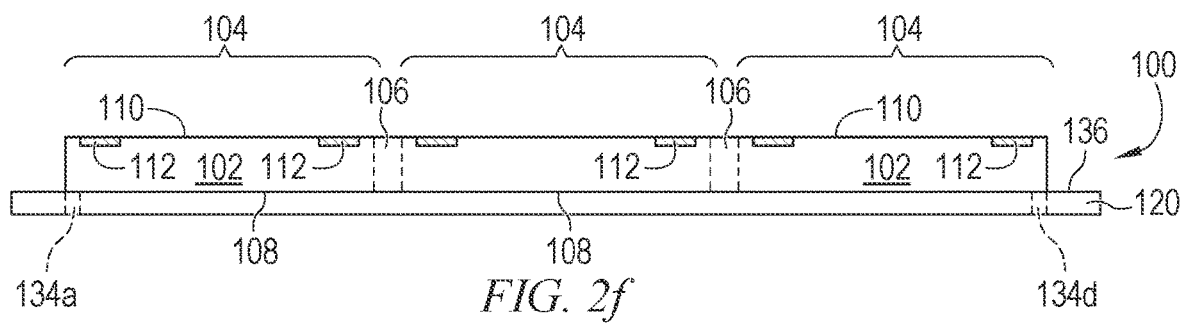

In FIG. 2d, semiconductor wafer 100 from FIG. 1b is disposed over BSC tape 120. In the present example, semiconductor wafer 100 is 450 mm in diameter. FIG. 2e shows active surface 110 of semiconductor wafer 100 disposed over and in contact with surface 136 of BSC tape 120. In another embodiment, FIG. 2f shows back surface 108 of semiconductor wafer 100 disposed over and in contact with surface 136 of BSC tape 120. Either orientation of semiconductor wafer 100 is applicable.

Figure 2G:
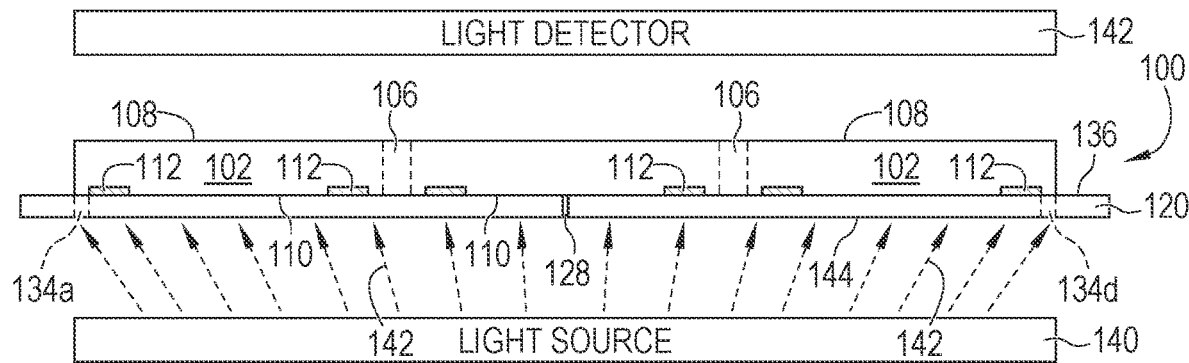
Figure 2H:
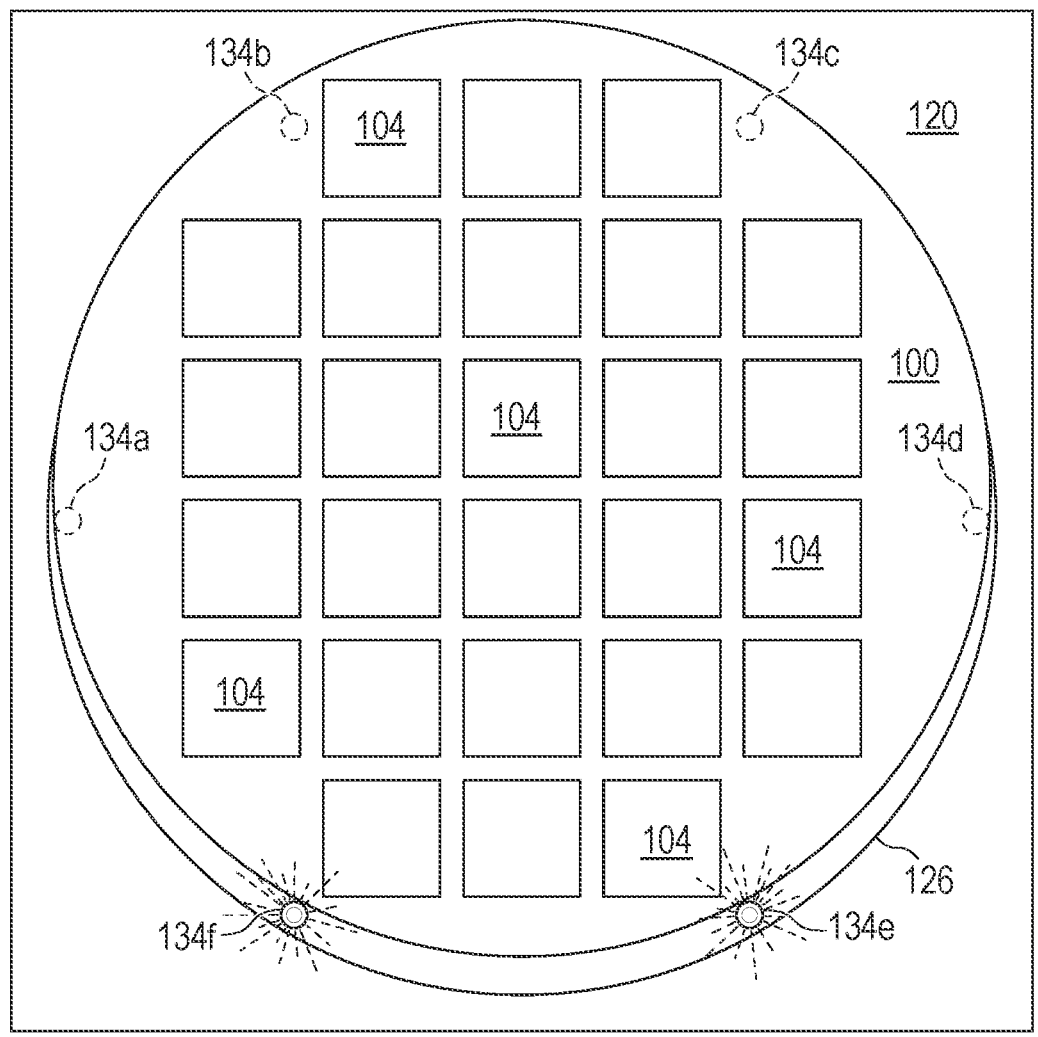

FIG. 2g shows light source 140 position below BSC tape 120. Light source 140 emits light waves 142 onto surface 144 of BSC tape 120. Depending on the position of semiconductor wafer 100, light waves 142 may or may not transmit through alignment holes 134a-134f. Assume semiconductor wafer 100 is off-center with respect to center 128. Again, alignment holes 134a-134f are formed just inside wafer alignment circle 126. Any material misalignment of semiconductor wafer 100 with respect to center 128 would allow light waves 142 to pass through one or more alignment holes 134a-134f. In other words, if misaligned with respect to center 128, semiconductor wafer 100 will not cover all alignment holes 134a-134f and light waves 142 will transmit through one or more uncovered alignment holes. In the top view of FIG. 2h, semiconductor wafer 100 is off-center with respect to center 128 and semiconductor wafer 100 does not cover alignment holes 134e and 134f. Light waves 142 will transmit through alignment holes 134e and 134f and be observable or detectable from the opposite side of BSC tape 120, i.e., above surface 136. Light waves 142 can be observable by human sight or detectable by light detector 146. Light detector 146 can give a visible or audible signal that light waves 142 have been detected above surface 136, after passing through one or more of alignment holes 134a-134f. Alignment holes 130a-130d and 132a-132d are intended for smaller semiconductor wafers and should not be relevant for a 450 mm semiconductor wafer.

Figure 2I:
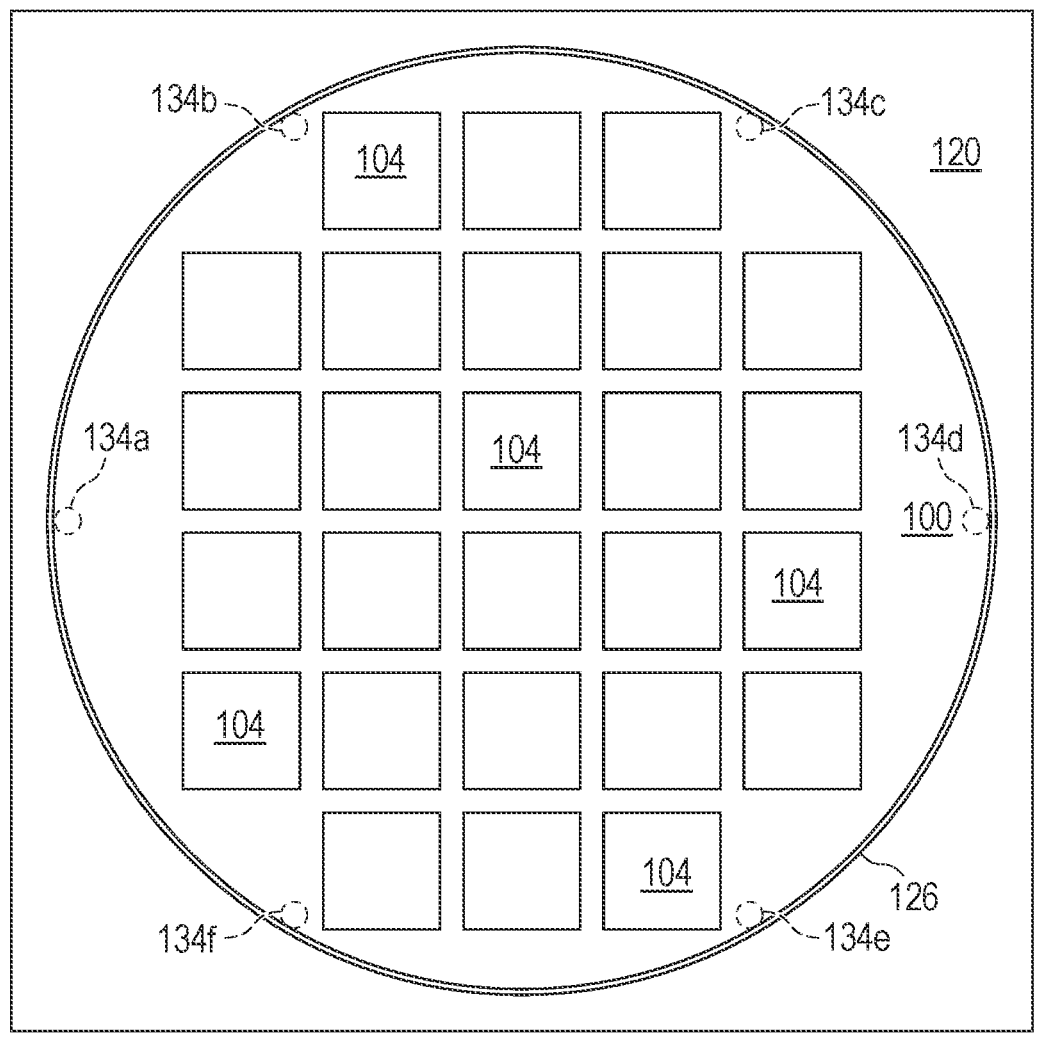

Given that semiconductor wafer 100 is off-center with respect to center 128 in FIG. 2b, the position of semiconductor wafer relative to center 128 can then be moved or adjusted until the semiconductor wafer covers all alignment holes 134a-134f. In that case, no light is observable or detectable through any of the alignment holes 134a-134f. When no light is observable or detectable through any of the alignment holes 134a-134f, as in FIG. 2i, then semiconductor wafer 100 is considered centered with respect to center 128.

Figure 3:
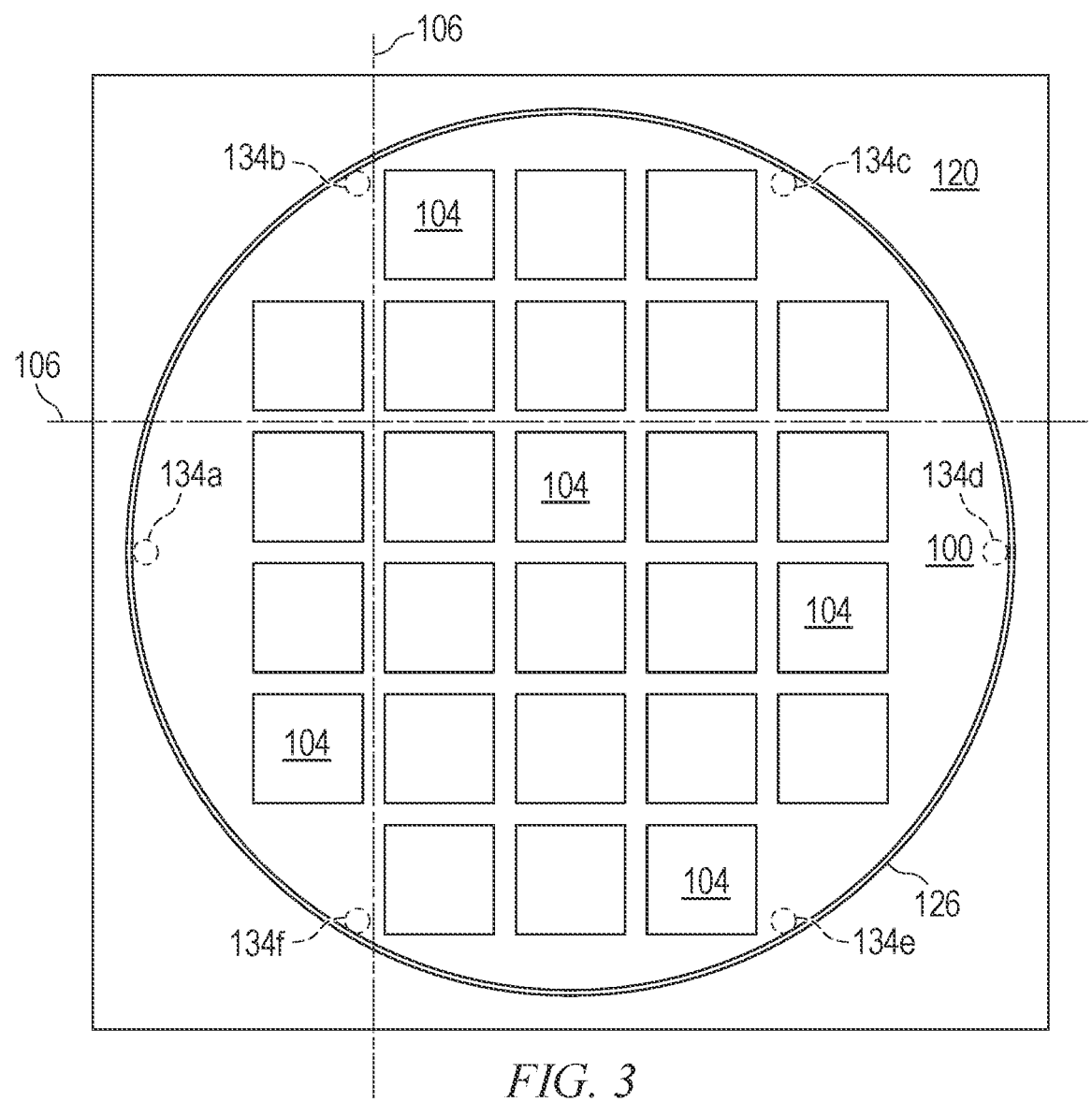
FIG. 3 illustrates the semiconductor wafer subject to a manufacturing operation.

Once centered, semiconductor wafer 100 can be subject to a variety of semiconductor manufacturing processes. As an example, semiconductor wafer 100 is singulated along saw streets 106, as shown in FIG. 3. The alignment of semiconductor wafer 100 with respect to center 128, as described above, provides precise control over the location of the dicing operation. Alternatively, semiconductor wafer 100 could be subject to pick and place operations, cleaning, and inspection.

Figure 4:
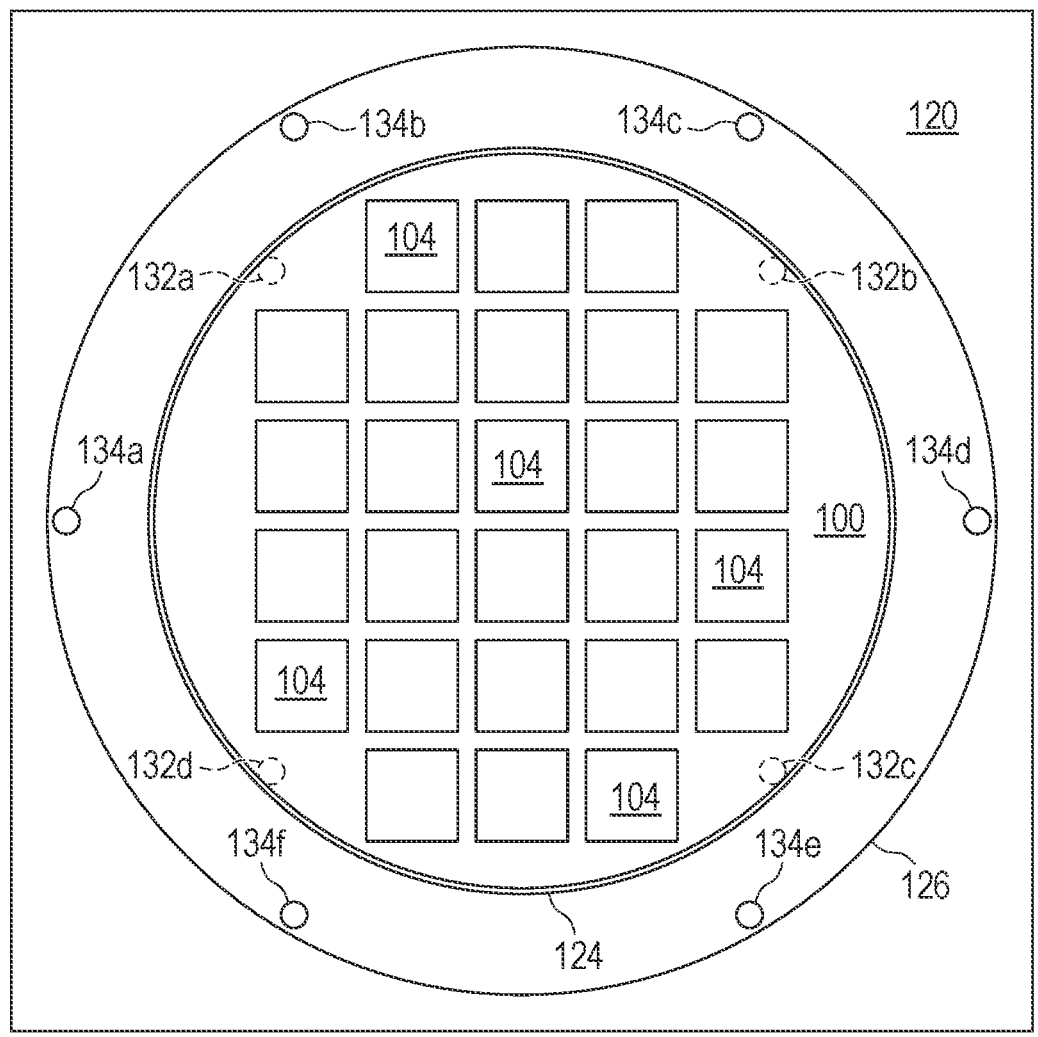
FIG. 4 illustrates a second sized semiconductor wafer centered on the wafer tape by the alignment holes.

FIG. 4 shows semiconductor wafer 100 mounted to BSC tape 120. In this case, semiconductor wafer 100 is 300 mm in diameter. If semiconductor wafer 100 is off-center with respect to center 128, light waves 142 pass through one or more alignment holes 132a-132d inside wafer alignment circle 124. In other words, if misaligned with respect to center 128, semiconductor wafer 100 will not cover all alignment holes 132a-132d and light waves 142 will transmit through the uncovered alignment holes, similar to FIG. 2h. Light waves 142 will transmit through the uncovered alignment holes and be observable or detectable from the opposite side of BSC tape 120, i.e., above surface 136. Again, light waves 142 can be observable by human sight or detectable by light detector 146. Light waves 142 are focused on alignment holes 132a-132d so any light passing through alignment holes 134a-134f would be negligible or disregarded.

If semiconductor wafer 100 is off-center with respect to center 128, the position of semiconductor wafer relative to center 128 can then be moved or adjusted until the semiconductor wafer covers all alignment holes 132a-132d. In that case, no light is observable or detectable through any of the alignment holes 132a-132d. When no light is observable or detectable through any of the alignment holes 132a-132d, as shown in FIG. 4, then semiconductor wafer 100 is considered centered with respect to center 128. Alignment holes 130a-130d are intended for a smaller semiconductor wafer and should not be relevant for a 300 mm semiconductor wafer.

Figure 5:
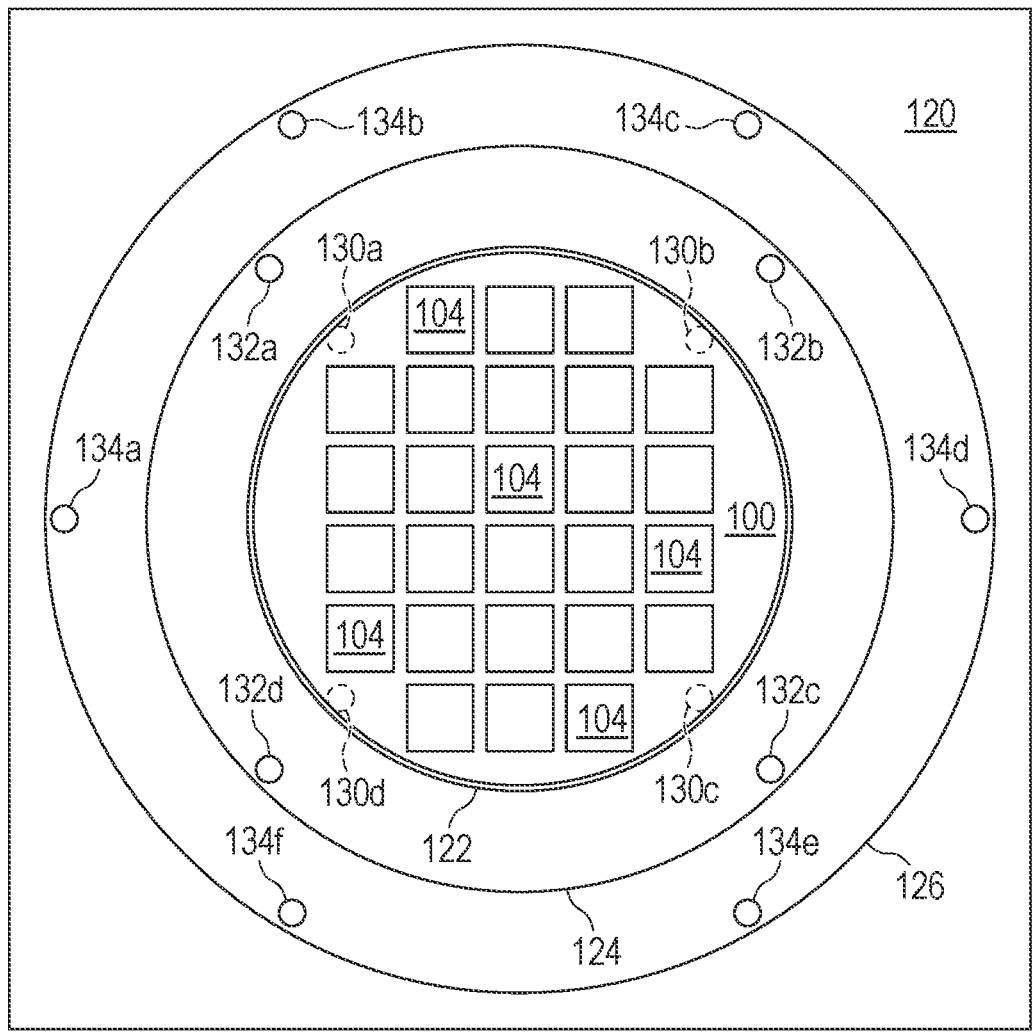
FIG. 5 illustrates a third sized semiconductor wafer centered on the wafer tape by the alignment holes.

FIG. 5 shows semiconductor wafer 100 mounted to BSC tape 120. In this case, semiconductor wafer 100 is 200 mm in diameter. If semiconductor wafer 100 is off-center with respect to center 128, light waves 142 pass through one or more alignment holes 130a-130d inside wafer alignment circle 122. In other words, if misaligned with respect to center 128, semiconductor wafer 100 will not cover all alignment holes 130a-130d and light waves 142 will transmit through one or more uncovered alignment holes, similar to FIG. 2h. Light waves 142 will transmit through the uncovered alignment holes and be observable or detectable from the opposite side of BSC tape 120, i.e., above surface 136. Again, light waves 142 can be observable by human sight or detectable by light detector 146. Light waves 142 are focused on alignment holes 130a-130d so any light passing through alignment holes 134a-134f and 132a-132d would be negligible or disregarded.

If semiconductor wafer 100 is off-center with respect to center 128, the position of semiconductor wafer relative to center 128 can then be moved or adjusted until the semiconductor wafer covers all alignment holes 130a-130d. In that case, no light is observable or detectable through any of the alignment holes 130a-102d. When no light is observable or detectable through any of the alignment holes 130a-130d, as shown in FIG. 5, then semiconductor wafer 100 is considered centered with respect to center 128.

Figure 6:
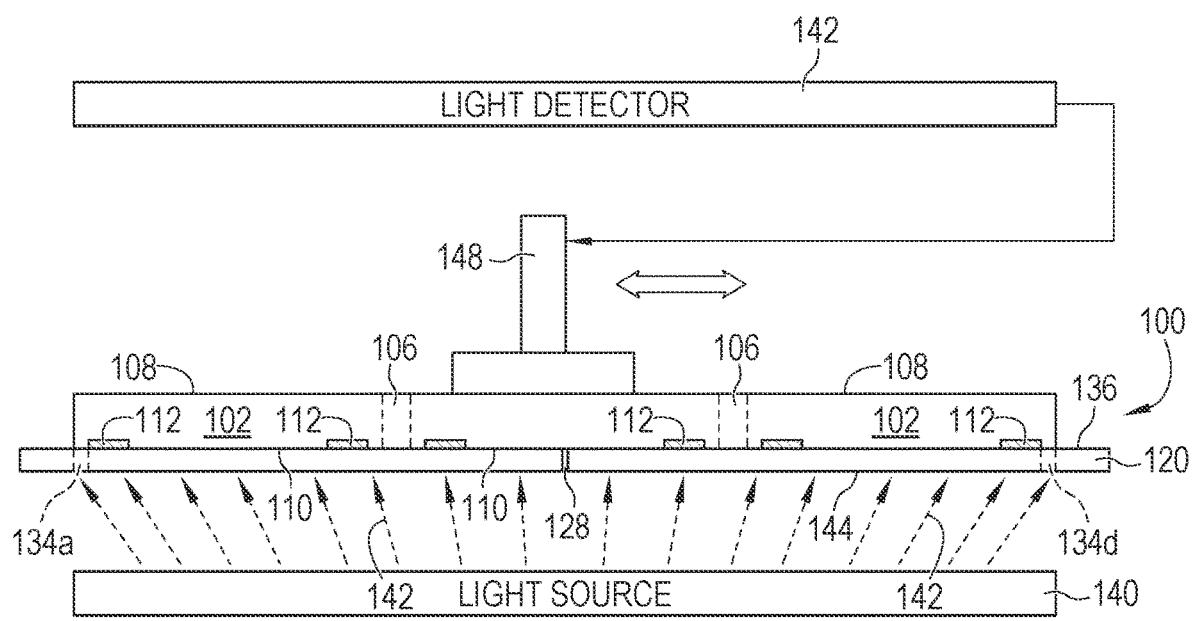
FIG. 6 illustrates a rectangular semiconductor wafer centered on the wafer tape by the alignment holes.

In another embodiment, semiconductor wafer 100 can be moved or adjusted by control arm 148 in response to light detector 146, as shown in FIG. 6. Control arm 148 is attached to semiconductor wafer 100. If light detector 146 detects light waves 142, then a control signal is sent to control arm 148 to move semiconductor wafer 100 to make a wafer position adjustment. Given the alignment holes where light is detected, control arm 148 will have information as to where to move semiconductor wafer 100. For example, if light is detected through alignment holes 134e-134f, as in FIG. 2h, then light detector 164 sends a control signal to control arm 148 to move semiconductor wafer 100 down with respect to center 128. Once the adjustment has been made, light detector 146 takes another reading and makes further adjustments in a similar manner, if necessary, until semiconductor wafer 100 covers all alignment holes 134a-134f and no light waves 142 are transmitted through BSC 120.

Figure 7:
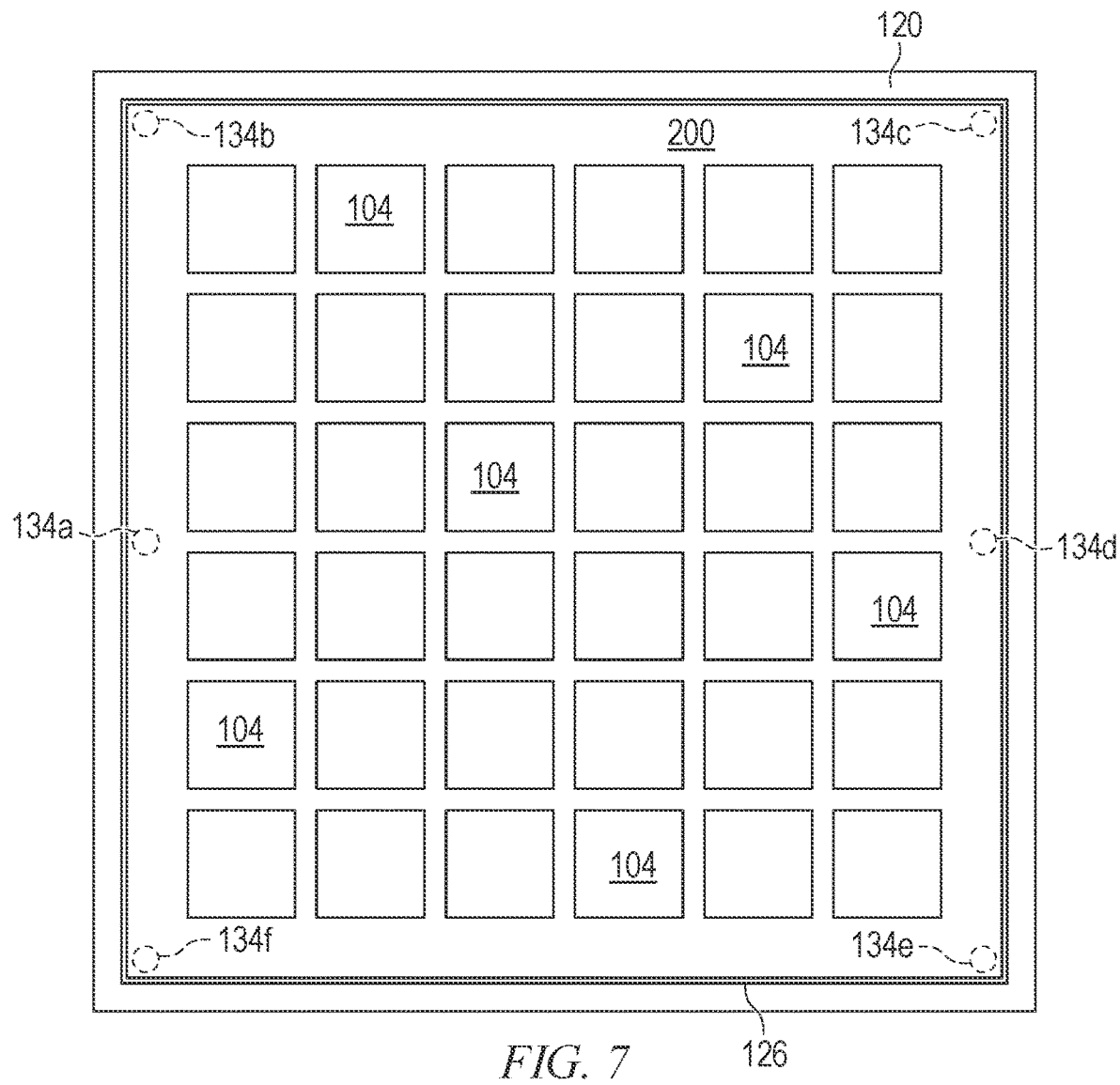
FIG. 7 illustrates a control arm to move the semiconductor wafer to a center of the wafer tape.

In another embodiment, semiconductor wafer 200 has a rectangular form-factor. Semiconductor wafer 200 is made similar to FIGS. 1a-1b. FIG. 7 shows rectangular semiconductor wafer 200 disposed over BSC tape 120. In this case, the wafer alignment markings would be rectangular. Semiconductor wafer 200 follows a similar description as FIGS. 2-6, with a rectangular form-factor. If semiconductor wafer 200 is misaligned, the light waves will transmit through one or more alignment holes and corrective action is taken, similar to FIGS. 2h-2i. If semiconductor wafer 200 is properly aligned, then no light waves will pass through any of the alignment holes of BSC tape 120 and the semiconductor wafer is considered properly centered.

Figure 1C:
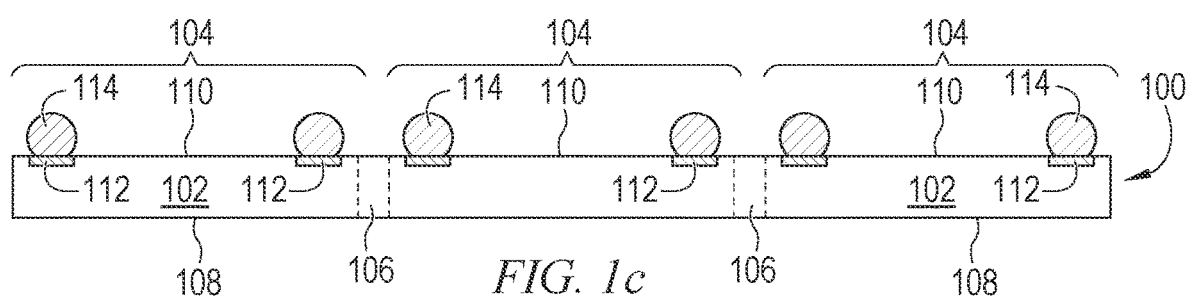

Returning to FIG. 1c, an electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1D:
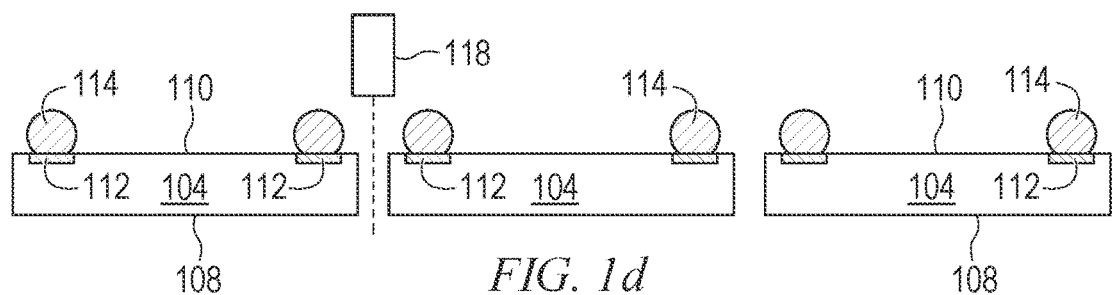

In FIG. 1d, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 8A:
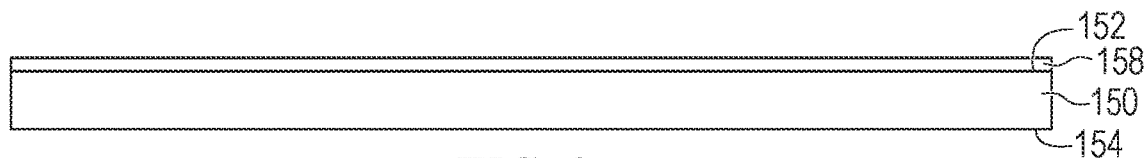
FIGS. 8a-8h illustrate a wafer tape with alignment holes to center a reconstituted wafer.

FIG. 8a shows a temporary substrate or carrier 150 containing sacrificial base material, such as silicon, polymer, beryllium oxide, glass, or other suitable low-cost, rigid material for structural support. Substrate 150 has major surface 152 and major surface 154, opposite surface 152. In one embodiment, carrier 150 is a support structure with a temporary bonding layer 158 formed over the carrier. Temporary bonding layer 158 can be a film or foil bonded to surface 152.

Figure 8B:
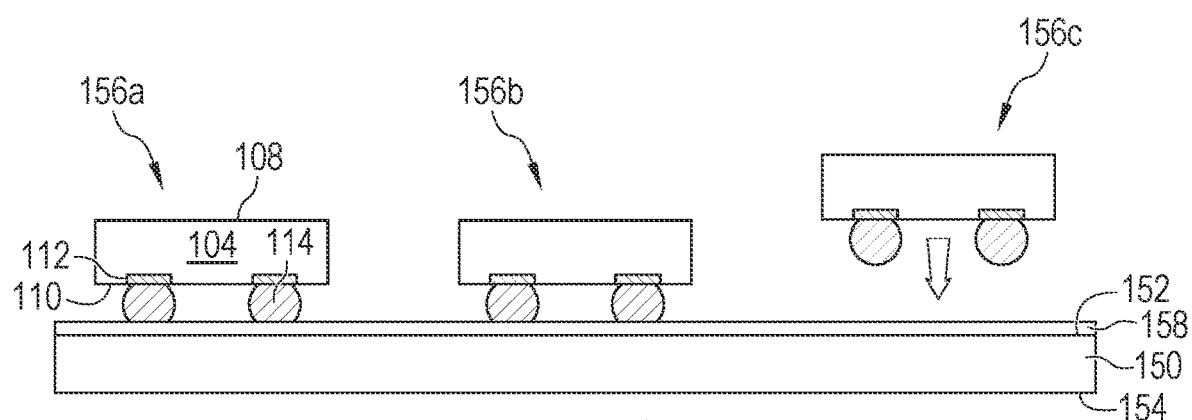

In FIG. 8b, electrical components 156a-156c are disposed on surface 152 of substrate 150. Electrical components 156a-156c can be similar to, or made similar to, semiconductor die 104 from FIG. 1d with bumps 114 oriented toward surface 152 of substrate 150. Alternatively, electrical components 156a-156c can include other semiconductor die, semiconductor packages, surface mount devices, RF components, discrete electrical devices, or integrated passive devices (IPD).

Figure 8C:
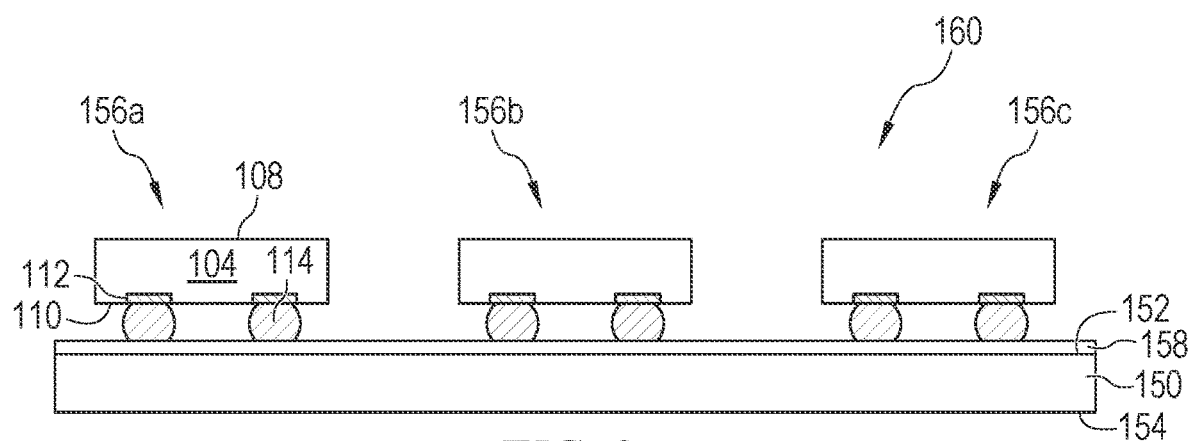
Figure 8D:
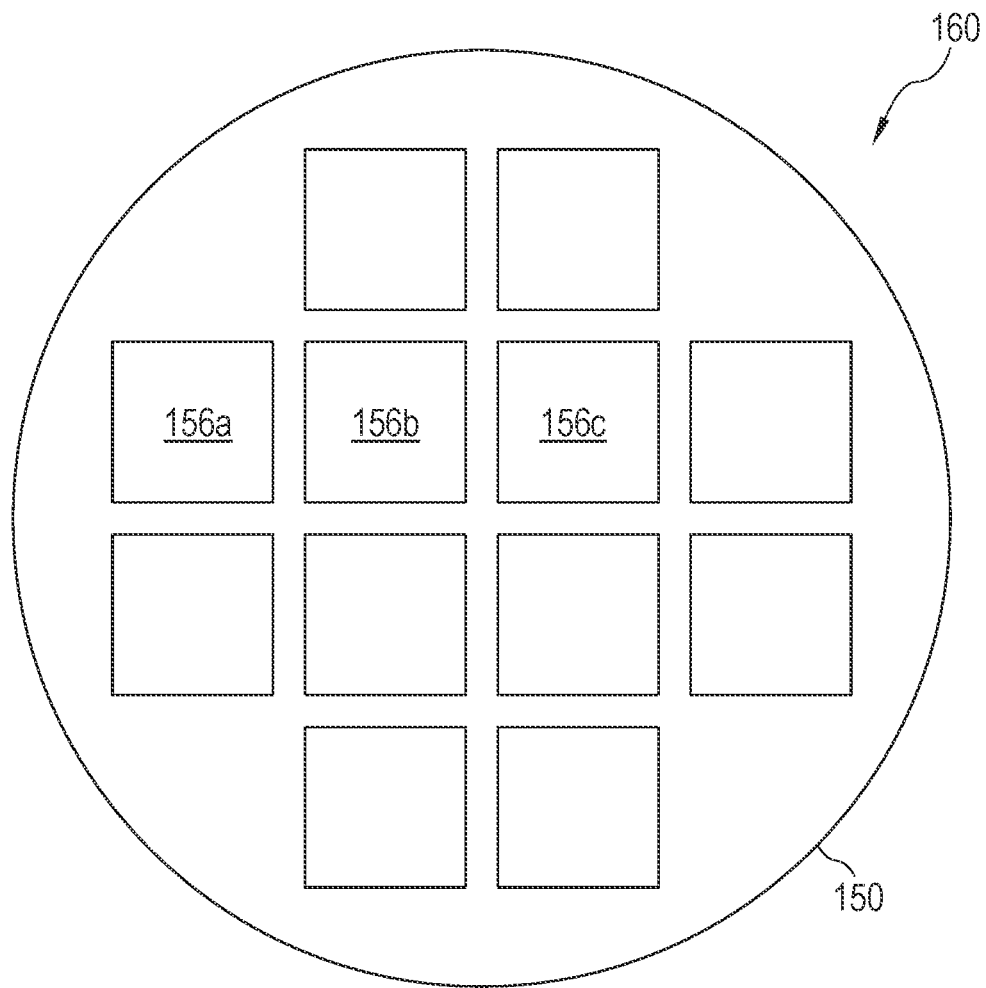

Electrical components 156a-156c are positioned over substrate 150 using a pick and place operation. Electrical components 156a-156b are brought into contact with bonding layer 158. FIG. 8c illustrates electrical components 156a-156c bonded to substrate 150, as a reconstituted wafer level package (WLP) 160. FIG. 8d is a top view of reconstituted WLP 160 with electrical components 156a-156c bonded to substrate 150. In the present example, reconstituted WLP 160 is 450 mm in diameter.

Figure 8E:
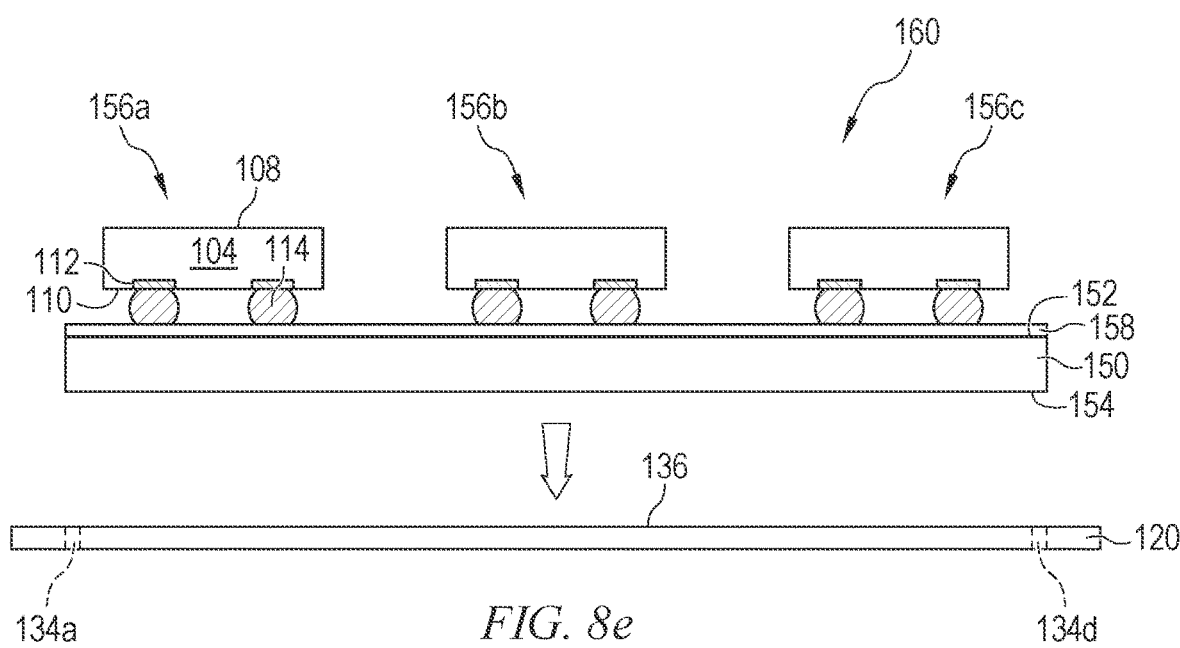
Figure 8F:
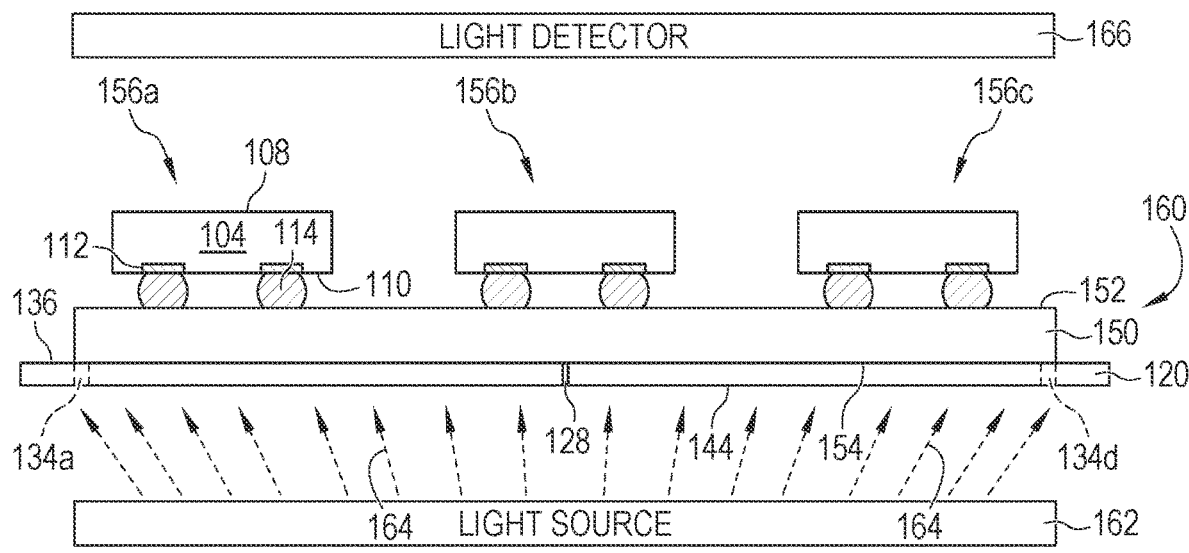

In FIG. 8e, reconstituted WLP 160 is disposed over BSC tape 120, similar to FIG. 2d. Components having a similar function are assigned the same reference number. FIG. 8f shows surface 154 of reconstituted WLP 160 disposed over and in contact with surface 136 of BSC tape 120.

Figure 8G:
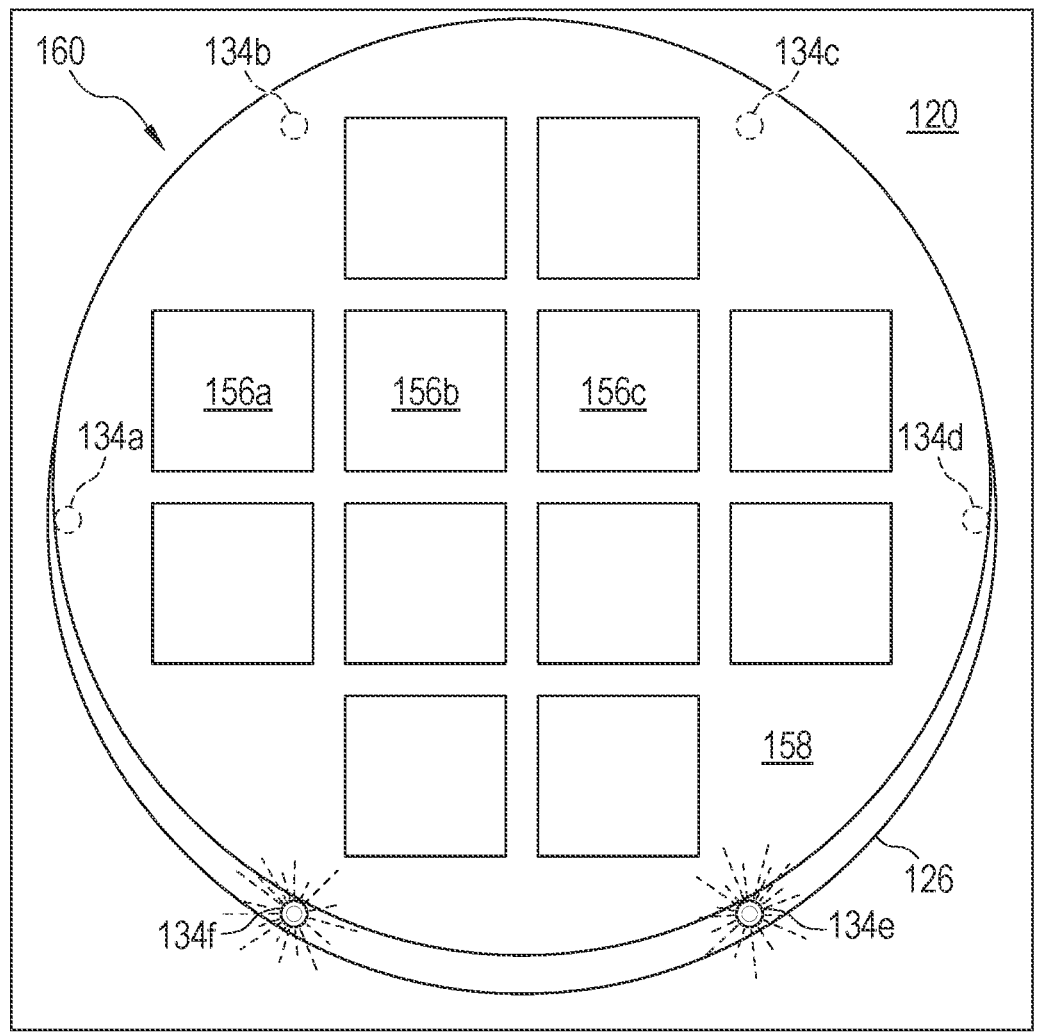

Light source 162 is positioned below BSC tape 120. Light source 162 emits light waves 164 onto surface 144 of BSC tape 120. Depending on the position of reconstituted WLP 160, light waves 164 may or may not transmit through alignment holes 134a-134f. Assume reconstituted WLP 160 is off-center with respect to center 128, as shown in FIG. 8g. Again, alignment holes 134a-134f are formed just inside wafer alignment circle 126. Any material misalignment of reconstituted WLP 160 with respect to center 128 would allow light waves 164 to pass through one or more alignment holes 134a-134f. In other words, if misaligned with respect to center 128, reconstituted WLP 160 will not cover all alignment holes 134a-134f and light waves 164 will transmit through one or more uncovered alignment holes. In this case, light waves 164 transmitting through alignment holes 134e and 134f will be observable or detectable from the opposite side of BSC tape 120, i.e., above surface 136. Light waves 164 can be observable by human sight or detectable by light detector 166. Light detector 166 can give a visible or audible signal that light waves 164 have been detected above surface 136, after passing through one or more of alignment holes 134a-134f.

Figure 8H:
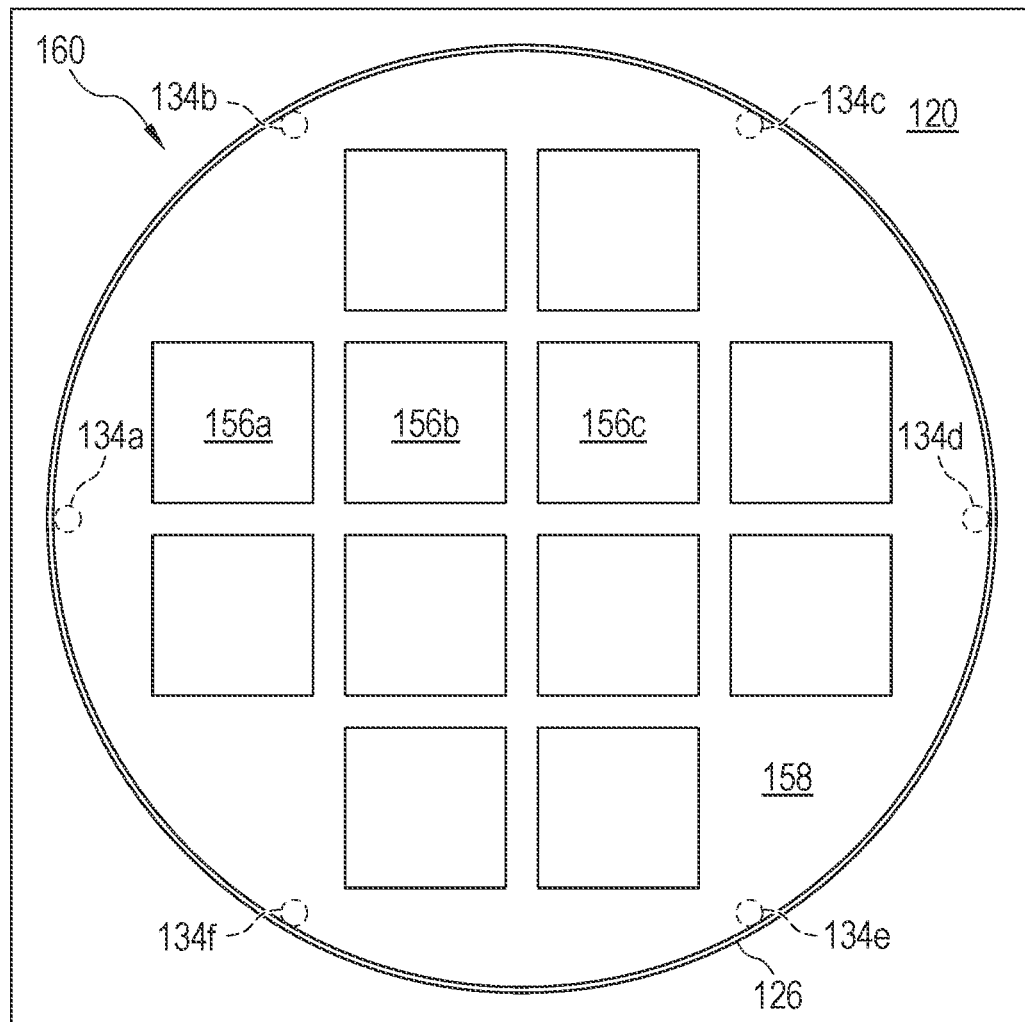

Given that reconstituted WLP 160 is off-center with respect to center 128, the position of the reconstituted WLP 160 relative to center 128 can then be moved or adjusted until the reconstituted WLP 160 covers all alignment holes 134a-134f. In that case, no light is observable or detectable through any of the alignment holes 134a-134f. When no light is observable or detectable through any of the alignment holes 134a-134f, as in FIG. 8h, then reconstituted WLP 160 is considered centered with respect to center 128.

Once centered, semiconductor wafer 160 can be subject to a variety of semiconductor manufacturing processes. As an example, semiconductor wafer 100 is singulated along saw streets 106, similar to FIG. 3. The alignment of semiconductor wafer 100 with respect to center 128, as described above, provides precise control over the location of the dicing operation.

Figure 9:
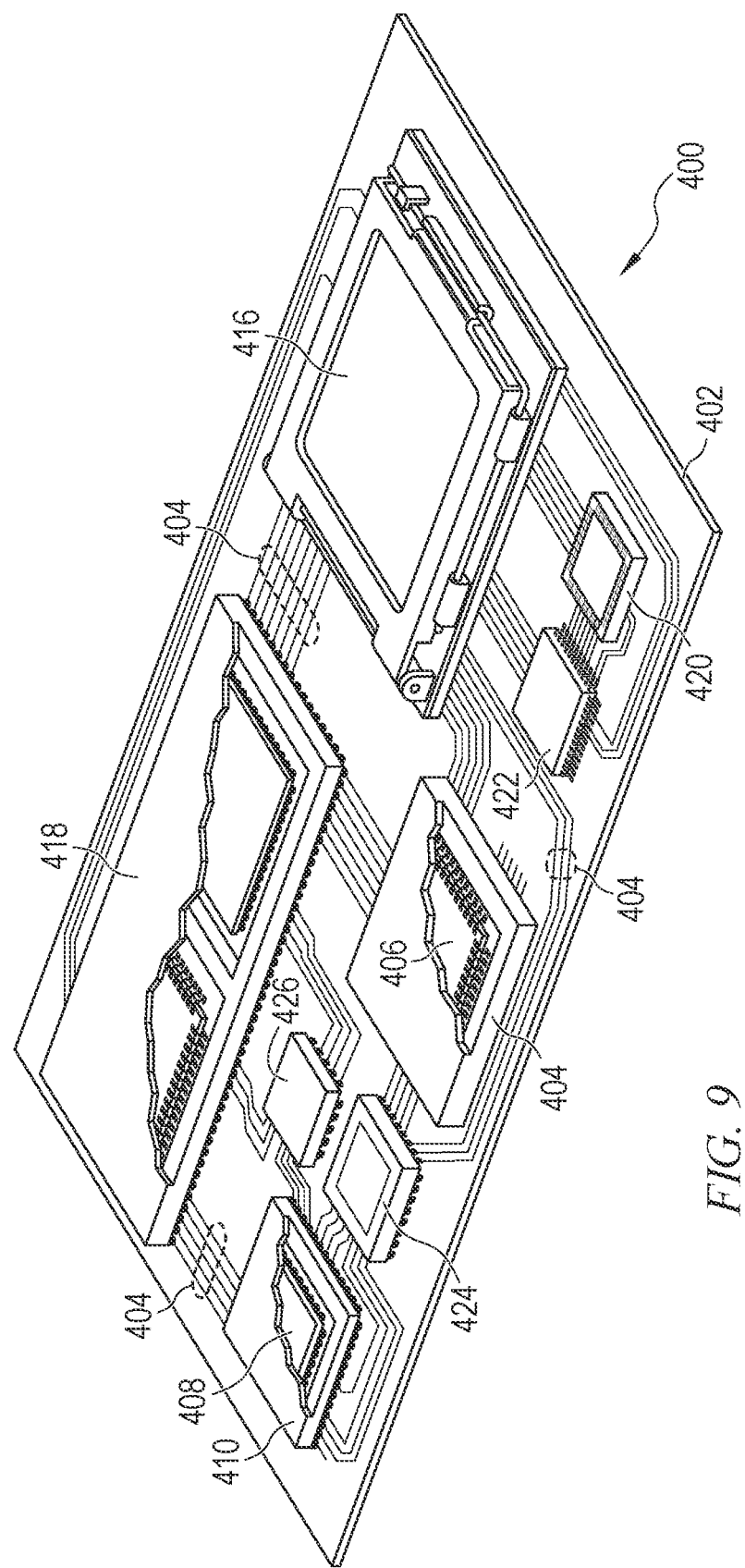
FIG. 9 illustrates a printed circuit board (PCB) with different types of packages disposed on a surface of the PCB.

FIG. 9 illustrates electrical device 400 having a chip carrier substrate or PCB 402 with a plurality of semiconductor packages disposed on a surface of PCB 402, including semiconductor die 104. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor manufacturing equipment, comprising:
   a wafer tape configured to receive a semiconductor wafer thereon, the wafer tape including a plurality of alignment holes formed through the wafer tape; and
   a light source disposed under the wafer tape,
   wherein the plurality of alignment holes and the light source are spatially arranged and configured to indicate a misaligned position of the semiconductor wafer on the wafer tape with light passing through one or more alignment holes.

2. The semiconductor manufacturing equipment of claim 1, wherein the plurality of alignment holes and the light source are spatially arranged and configured to indicate a centered position of the semiconductor wafer on the wafer tape with no light passing through the one or more alignment holes.

3. The semiconductor manufacturing equipment of claim 1, wherein the wafer tape includes a plurality of wafer alignment markings for different size semiconductor wafers.

4. The semiconductor manufacturing equipment of claim 3, wherein the alignment holes are located inside the wafer alignment markings, respectively.

5. The semiconductor manufacturing equipment of claim 1, further including a light detector disposed over the semiconductor wafer to detect light passing through the wafer tape.

6. The semiconductor manufacturing equipment of claim 1, wherein the semiconductor wafer includes a circular or rectangular form-factor.

7. A semiconductor manufacturing equipment, comprising:
   a wafer tape configured to receive a semiconductor wafer thereon, the wafer tape including a plurality of alignment holes formed through the wafer tape; and
   a light source disposed under the wafer tape, wherein the plurality of alignment holes and the light source are spatially arranged and configured to indicate a misaligned position of the semiconductor wafer on the wafer tape with no light passing through one or more alignment holes.

8. The semiconductor manufacturing equipment of claim 7, wherein the plurality of alignment holes and the light source are spatially arranged and configured to indicate a centered position of the semiconductor wafer on the wafer tape with light passing through the one or more alignment holes.

9. The semiconductor manufacturing equipment of claim 7, wherein the wafer tape includes a plurality of wafer alignment markings for different size semiconductor wafers.

10. The semiconductor manufacturing equipment of claim 9, wherein the alignment holes are located inside the wafer alignment markings, respectively.

11. The semiconductor manufacturing equipment of claim 7, further including a light detector disposed over the semiconductor wafer to detect light passing through the wafer tape.

12. The semiconductor manufacturing equipment of claim 11, further including a control arm attached to the semiconductor wafer to provide the ability to move the semiconductor wafer in response to a control signal from the light detector.

13. The semiconductor manufacturing equipment of claim 7, wherein the semiconductor wafer includes a circular or rectangular form-factor.

14. A method of making a semiconductor device, comprising:
    providing a wafer tape including a plurality of alignment holes formed through the wafer tape;
    disposing a semiconductor wafer over the wafer tape; and
    disposing a light source under the wafer tape, wherein the semiconductor wafer is misaligned on the wafer tape when light passes through one or more alignment holes.

15. The method of claim 14, wherein the semiconductor wafer is centered on the wafer tape when no light passes through the one or more alignment holes.

16. The method of claim 14, wherein the wafer tape includes a plurality of wafer alignment markings for different size semiconductor wafers.

17. The method of claim 16, wherein the alignment holes are located inside the wafer alignment markings, respectively.

18. The method of claim 14, further including disposing a light detector over the semiconductor wafer to detect light passing through the wafer tape.

19. The method of claim 14, wherein the semiconductor wafer includes a circular or rectangular form-factor.

20. A method of making a semiconductor device, comprising:
    providing a wafer tape including a plurality of alignment holes formed through the wafer tape;
    disposing a semiconductor wafer over the wafer tape to cover the alignment holes; and
    disposing a light source under the wafer tape, wherein the semiconductor wafer is centered on the wafer tape when no light passes through one or more alignment holes.

21. The method of claim 20, wherein the semiconductor wafer is misaligned on the wafer tape when light passes through the one or more alignment holes.

22. The method of claim 20, wherein the wafer tape includes a plurality of wafer alignment markings for different size semiconductor wafers.

23. The method of claim 20, further including disposing a light detector over the semiconductor wafer to detect light passing through the wafer tape.

24. The method of claim 23, further including attaching a control arm to the semiconductor wafer to provide the ability to move the semiconductor wafer in response to a control signal from the light detector.

25. The method of claim 20, wherein the semiconductor wafer includes a circular or rectangular form-factor.

* * * * *